(12) United States Patent
Tucker et al.

(10) Patent No.: US 6,400,738 B1
(45) Date of Patent: Jun. 4, 2002

(54) TUNABLE FABRY-PEROT FILTERS AND LASERS

(75) Inventors: Rodney S. Tucker, Hawthron (AU); Wayne V. Sorin, Mountain View, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/550,547

(22) Filed: Apr. 14, 2000

(51) Int. Cl.[7] .............................. H01S 3/10; H01S 3/13; H01S 3/105

(52) U.S. Cl. ............................ 372/20; 372/99; 372/50; 359/260

(58) Field of Search .............................. 372/92, 98, 99, 372/107, 108, 20, 28; 356/352; 359/378, 379, 291, 292, 223, 224, 260

(56) References Cited

U.S. PATENT DOCUMENTS 6,078,395 A * 6/2000 Jourdain et al. ............ 356/352
6,275,324 B1 * 8/2001 Sneh ........................... 359/291
6,295,130 B1 * 9/2001 Sun et al. .................... 356/454
2001/0017876 A1 * 8/2001 Kner et al. ..................... 372/50

* cited by examiner

*Primary Examiner*—Paul Ip
*Assistant Examiner*—Davienne Monbleau

(57) ABSTRACT

A tunable optical cavity constructed from a fixed mirror and a movable mirror. The fixed mirror is attached to a substrate having a first electrically conducting surface. A support member having the moveable mirror supported thereon and having a second electrically conducting surface, is suspended above the substrate. A circuit applies an electrical potential between the first and second electrically conducting surfaces thereby adjusting the distance between the fixed and movable mirrors. The fixed mirror and the moveable mirror are positioned such that the mirrors form the opposite ends of the optical cavity. The distance between the fixed mirror and the moveable mirror is a function of the applied electrical potential. The fixed mirror is mounted in a well in the substrate such that distance between the support member and the substrate is less than half the distance between the mirrors.

2 Claims, 2 Drawing Sheets

TUNABLE FABRY-PEROT FILTERS AND LASERS

FIELD OF THE INVENTION

The present invention relates to optical filters, and more particularly, to tunable Fabry-Perot optical resonators, filters and lasers constructed therefrom.

BACKGROUND OF THE INVENTION

Tunable optical resonators are utilized in optical communication systems and in the construction of lasers. Optical filters and lasers based on Fabry-Perot resonators can be constructed using microelectromechanical machining (MEM) techniques, and hence, can, in principle, provide an economically attractive tunable filter or tunable laser. In such devices, a Fabry-Perot resonator cavity is formed between two mirrors. One of these mirrors is flat and located on a semiconductor substrate. The other mirror may be curved and is suspended on a number of micro-mechanical cantilevers. Application of a tuning voltage between the cantilevers and the substrate causes the suspended mirror to move towards the fixed mirror on the substrate, thereby reducing the spacing between the two mirrors of the Fabry-Perot resonator. Since the filter's bandpass frequency is determined by the mirror spacing, a reduction in spacing between the two mirrors causes the resonant optical frequency of the cavity to increase. The shift in the resonant frequency enables the device to be used directly as a tunable bandpass filter. If an optically-pumped or electrically-pumped optical gain medium (active region) is placed in the cavity, the device becomes a tunable laser, with the lasing wavelength controlled by the resonant frequency of the Fabry-Perot cavity.

Prior art MEM Fabry-Perot filters exhibit a significant amount of noise, which limits the usefulness of these devices. The noise results from mechanical vibrations in the mirror connected to the cantilevers. This noise causes variations in the spacing between the mirrors, which in turn, causes the resonant frequency and amplitude of the light emitted from the filter to exhibit a corresponding noise spectrum. The noise broadening of the resonant frequency can double the width of the passband response of a filter and can substantially increase the linewidth of a laser constructed from such a filter, thereby making the filter or laser unsuitable for many applications.

The mechanical vibrations can be reduced by stiffening the cantilevers or by increasing the distance between the mirrors. The mechanical vibrations result from thermal noise in the movable mirror and its micro-mechanical cantilevers. Since the moveable mirror is in thermal equilibrium with the air around the mirror, the mirror vibrates with an amplitude determined by the air temperature and the mechanical properties of the mirror and support. This vibration causes mechanical fluctuations in the position of the movable mirror relative to the other mirror. These mechanical fluctuations, in turn, cause fluctuations in the resonant optical frequency of the Fabry-Perot cavity. The mechanical fluctuations are exacerbated by any mechanical resonance in the moveable mirror and its support cantilevers. Stiffening a cantilever increases the spring constant of the cantilever, and hence, reduces the amplitude of the fluctuations corresponding to any given equilibrium temperature.

Unfortunately, stiffening the cantilever also reduces the range over which the resonance frequency can be tuned. In general, there is a maximum deflection voltage that can be applied to the device. This voltage is usually determined by the driving circuitry and the voltage breakdown characteristics of the Fabry Perot resonator structure. The maximum deflection voltage determines the maximum range over which the frequency of the filter or laser can be tuned. Hence, stiffening the cantilever by increasing the thickness of the support arm also reduces the range over which the device can be tuned. Increasing the distance between the mirrors reduces the variation in the resonance frequency that results from the thermal vibration. However, increasing the distance between the mirrors also decreases the electric field acting on the moveable cantilever and mirror, and hence, the force obtained for any given deflection voltage is reduced.

Broadly, it is the object of the present invention to provide an improved MEM Fabry-Perot resonator.

It is a further object of the present invention to provide a MEM Fabry-Perot resonator that has reduced noise while maintaining or improving the range over which the resonance frequency can be tuned.

These and other objects of the present invention will become apparent to those skilled in the art from the following detailed description of the invention and the accompanying drawings.

SUMMARY OF THE INVENTION

The present invention is a tunable optical cavity constructed from a fixed mirror and a movable mirror. The fixed mirror is attached to a substrate having a first electrically conducting surface. A support member having the moveable mirror supported thereon and having a second electrically conducting surface, is suspended above the substrate. A circuit applies an electrical potential between the first and second electrically conducting surfaces thereby adjusting the distance between the fixed and movable mirrors. The fixed mirror and the moveable mirror are positioned such that the mirrors form the opposite ends of the optical cavity. The distance between the fixed mirror and the moveable mirror is a function of the applied electrical potential. The fixed mirror is mounted in a well in the substrate such that distance between the support member and the substrate is less than half the distance between the mirrors.

DETAILED DESCRIPTION OF THE INVENTION

Figure 2:
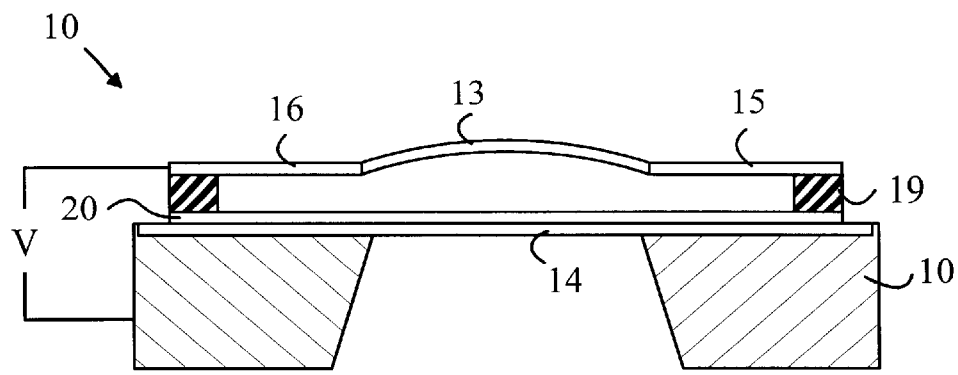
FIG. 2 is a cross-sectional view of the laser shown in FIG. 1 through line 11–12.
Figure 1:
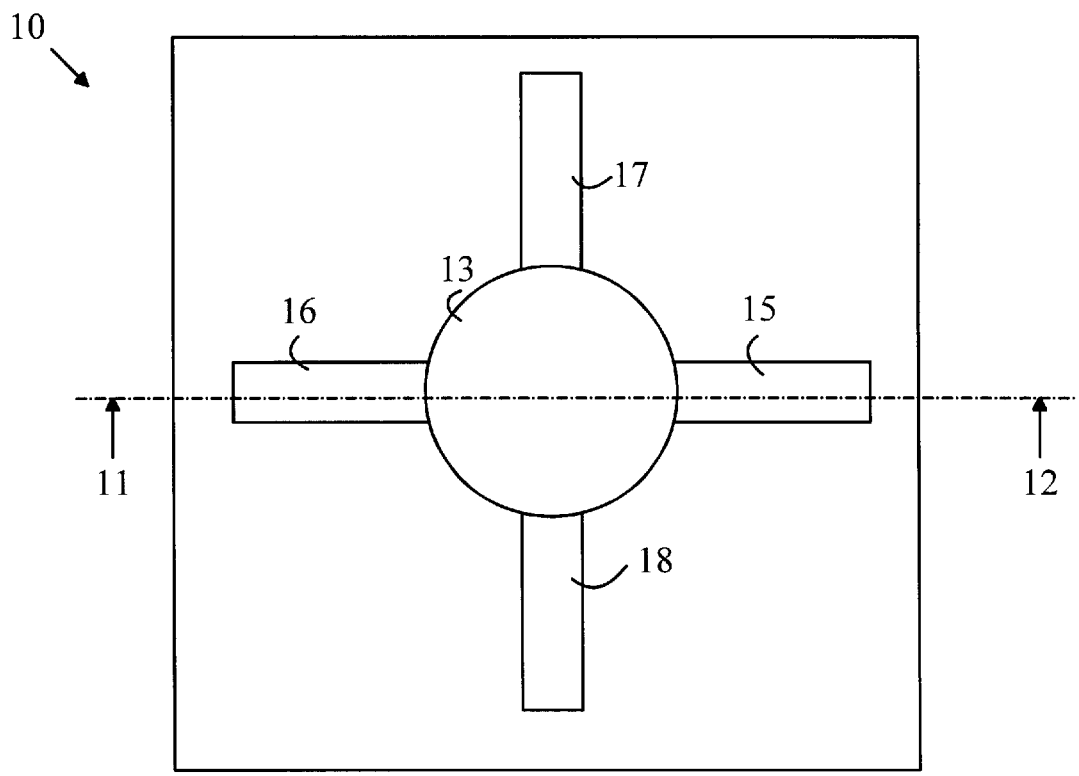
FIG. 1 is a top view of a Fabry-Perot based filter or laser.

The present invention may be more easily understood with reference to FIGS. 1 and 2. FIG. 1 is a top view of a Fabry-Perot based filter or laser. FIG. 2 is a cross-sectional view of the laser shown in FIG. 1 through line 11–12. A Fabry-Perot resonator cavity is formed between mirrors 13 and 14. Mirror 14 is flat and located on a semiconductor substrate 10. The mirror 13 is typically curved and is suspended on a number of micromechanical cantilevers shown at 15–18 that include a spacer 19. The mirrors are preferably constructed from a number of layers of transparent material having indices of refraction that alternate from layer to layer. Such mirrors are well known to the art of semiconductor lasers, and hence, will not be discussed in detail here To simplify the drawing, the layered structure of the mirrors has been omitted.

The application of a tuning voltage between the cantilevers and the substrate causes suspended mirror 13 to move towards mirror 14, thereby reducing the spacing between the two mirrors of the Fabry-Perot cavity. Since the resonant frequency of the cavity is determined by the distance between the mirrors, this reduction in spacing between the two mirrors causes the resonant optical frequency of the cavity to increase. The shift in the resonant frequency enables the device to be used directly as a tunable bandpass filter. If an optically-pumped or electrically-pumped optical gain medium 20 is placed in the cavity, the device becomes a tunable laser, with the lasing wavelength controlled by the resonant frequency of the Fabry-Perot cavity.

A key feature of the MEM filter and MEM tunable laser is the relatively small spacing between the two mirrors of the optical cavity. Mirror spacings of a few microns can be utilized with a tuning range of 60 nanometers or more, for an input tuning voltage range of about 30 volts.

As noted above, prior art devices of the type shown in FIGS. 1 and 2 suffer from undesirable frequency noise caused by the thermal energy associated with the mirror and its support structure. In essence, for any fixed input control voltage applied to the device, the center frequency of the filter randomly fluctuates about an average value. Since the filter attenuation function varies with frequency, this fluctuation in the center frequency leads fluctuations in the amplitude of the filtered light. These fluctuations render the filter useless in many applications.

The thermal fluctuations result from the fact that the mirror assembly is in thermal equilibrium with the surrounding environment. The mirror is mounted on the cantilevers, which act as springs. The thermal energy causes the mirror to oscillate with a displacement that depends on the spring constants and on the temperature. The mirror assembly must oscillate with a mechanical displacement that is determined by the corresponding equilibrium energy at the ambient temperature. The amplitude of the oscillation can be reduced by increasing the spring constants or reducing the absolute temperature. To obtain a significant decrease in the oscillation amplitude by lowering the temperature would require cooling the filter to the temperature of liquid nitrogen or below, and hence is not practical for many applications.

One method for reducing the effects of the thermally induced vibrations is to increase the distance between the mirrors at resonance. The amplitude of the thermally induced vibrations is independent of the distance between the mirrors. Denote the average thermal vibration amplitude by D. The cavity will have a resonant wavelength, L, if the distance between the mirrors is NL/2 where N is a positive integer. The average fluctuation in the resonant wavelength caused by the thermal vibration is 2D/N. Hence, the effects of the thermal noise are reduced by increasing the mirror spacing.

As discussed above, the frequency of the Fabry-Perot filter is adjusted by changing the distance between the fixed and moveable mirrors. The distance is adjusted by causing the support membrane to move so that the distance between the mirrors decreases or increases accordingly. The distance between the membrane and the underlying substrate is adjusted by applying a voltage between the membrane and substrate. For the purposes of this discussion, it will be assumed that both the membrane and substrate have been doped such that both are conducting. Alternatively, an electrode can be deposited on one or both of the members.

In general, there is a maximum drive voltage that can be applied to the Fabry-Perot filter, since this drive voltage is typically generated by digital circuitry constructed on semiconductor substrates. Accordingly, it would be advantageous to provide a Fabry-Perot design that maximizes the deflection available for any given drive voltage. The deflection obtained for any given drive voltage is inversely proportional to the square of the distance between the membrane that supports the mirror and the underlying substrate; hence, reducing the substrate to membrane distance provides a means for maximizing the deflection as a function of voltage. However, the distance between the mirrors is determined by the wavelength of the filter and the amount of noise that can be tolerated. Hence, there is a lower limit on the distance between the mirrors.

Figure 3:
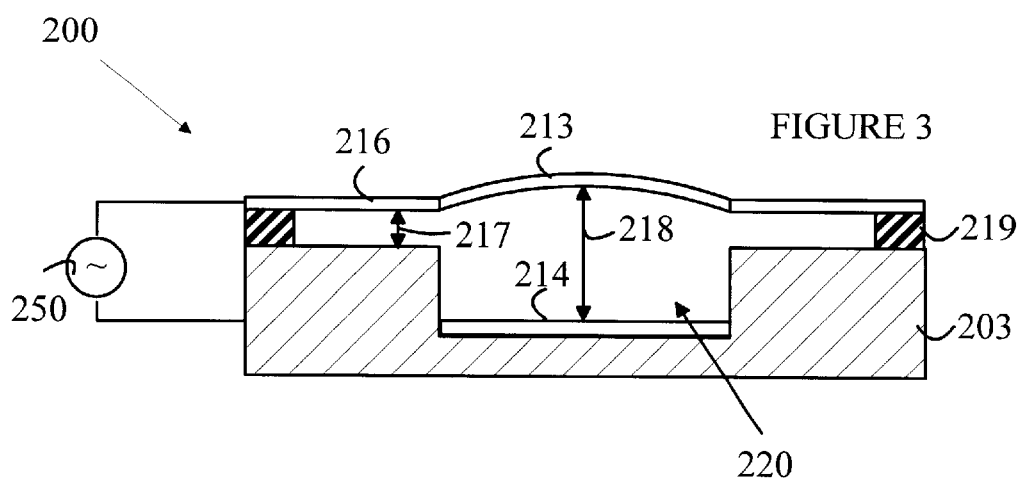
FIG. 3 is a cross-sectional view of a Fabry-Perot filter 200 according the present invention.

Refer now to FIG. 3 which is a cross-sectional view of a Fabry-Perot filter 200 according to the present invention. The moveable mirror in Filter 200 is mounted on a membrane 216 that is supported over the substrate by a spacer 219. The distance between membrane 216 and the substrate is altered by applying a voltage between the membrane and substrate 203 via circuit 250. Filter 200 utilizes a design in which the maximum distance 218 between the mirrors is set independently of the distance 217 between substrate 203 and the support membrane 216. The fixed mirror 214 is located in a well 220 that is etched in substrate 203. Hence, filter 200 provides a relatively large separation between the mirrors while providing a relatively small separation between membrane 216 and substrate 203. The minimum membrane-substrate distance is now set by the range of frequency values over which the resonance frequency of filter 200 is to be adjustable. This distance can be as small as half an optical wavelength. In contrast, the distance between the mirrors is typically approximately 5 wavelengths or more; however, the present invention represents a significant improvement over the prior art cavities even in the case in which the well is only half an optical wavelength in depth. Accordingly, filter 200 provides lower noise while actually reducing the maximum drive voltage needed to adjust the mirror positions.

Figure 4:
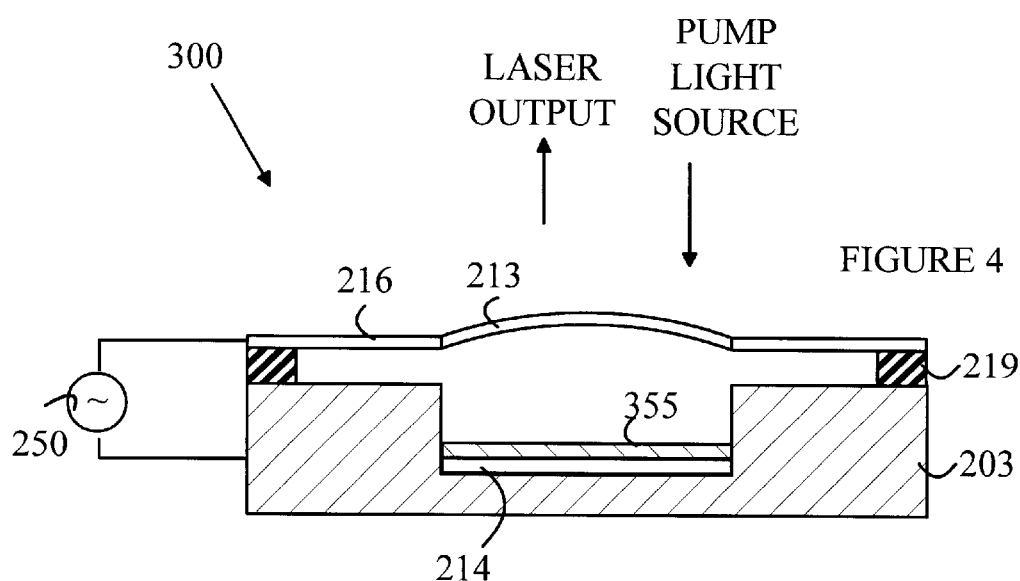
FIG. 4 is a cross-sectional view of Fabry-Perot laser 300 according to the present invention.

As noted above, a Fabry-Perot filter such as filter 200 can be converted to a laser by including an optically active gain layer within the cavity. Refer now to FIG. 4 which is a cross-sectional view of a Fabry-Perot laser 300 constructed from a Fabry-Perot filter such as that shown in FIG. 3 by including an optical gain layer 355 between the mirrors. To simplify the discussion, those elements of laser 300 that perform functions analogous to elements shown in FIG. 3 have been given the same reference numbers as utilized in FIG. 3. Gain layer 355 is optically pumped at a first wave length at which mirror 213 is transparent. However, embodiments in which the gain layer is pumped electrically will also be apparent to those skilled in the art from the preceding discussion.

Various modifications to the present invention will become apparent to those skilled in the art from the foregoing description and accompanying drawings. Accordingly, the present invention is to be limited solely by the scope of the following claims.

What is claimed is:

1. A tunable optical cavity having a resonant wavelength selectable in a range about a predetermined wavelength, said cavity comprising:

a fixed mirror attached to a substrate having a first electrically conducting surface;

a support member having a moveable mirror supported thereon, said support member having a second electrically conducting surface, said support member being suspended above said substrate; and a circuit for applying an electrical potential between said first and second electrically conducting surfaces, wherein said fixed mirror is located in a well in said substrate such that the distance between said support member and said substrate is less than half the distance between said mirrors and wherein said fixed mirror and said moveable mirror are positioned such that said mirrors form the opposite ends of said optical cavity, wherein the distance between said fixed mirror and said moveable mirror is a function of said applied electrical potential.

2. The optical cavity of claim 1 further comprising an active layer for amplifying light trapped in said cavity.

* * * * *